(12) United States Patent
McLeod (10) Patent No.: US 7,041,202 B2
(45) Date of Patent: May 9, 2006

(54) TIMING APPARATUS AND METHOD TO SELECTIVELY BIAS DURING SPUTTERING

(75) Inventor: Paul Stephen McLeod, Berkeley, CA (US)

(73) Assignee: Seagate Technology LLC, Scotts Valley, CA (US)

(*) Notice: Subject to any disclaimer, the term of this patent is extended or adjusted under 35 U.S.C. 154(b) by 271 days.

(21) Appl. No.: 10/629,772

(22) Filed: Jul. 28, 2003

(65) Prior Publication Data

US 2004/0069614 A1    Apr. 15, 2004

Related U.S. Application Data

(60) Provisional application No. 60/400,797, filed on Aug. 2, 2002.

(51) Int. Cl.
*C23C 14/34* (2006.01)

(52) U.S. Cl. ............... 204/192.12; 204/298.06; 204/298.23

(58) Field of Classification Search ........... 204/192.12, 204/298.23, 298.26, 298.06
See application file for complete search history.

(56) References Cited

U.S. PATENT DOCUMENTS

| | | | |
|---|---|---|---|
| 4,749,465 A | 6/1988 | Flint et al. ............ 204/298.25 |
| 5,490,910 A | 2/1996 | Nelson et al. ......... 204/192.15 |
| 5,523,173 A | 6/1996 | Doerner et al. ............ 428/611 |
| 5,569,533 A | 10/1996 | Lal et al. .................... 428/332 |
| 5,660,114 A | 8/1997 | Gruber ....................... 104/168 |
| 5,683,561 A | 11/1997 | Hollars et al. ......... 204/298.25 |
| 5,750,270 A | 5/1998 | Tang et al. ................. 428/611 |
| 5,753,092 A | 5/1998 | Hollars et al. ......... 204/298.36 |
| 5,762,766 A | 6/1998 | Kurita et al. ............ 204/192.2 |
| 5,814,196 A | 9/1998 | Hollars et al. ......... 204/298.15 |
| 6,010,795 A | 1/2000 | Chen et al. ................. 428/611 |
| 6,036,824 A | 3/2000 | Hedgcoth .............. 204/192.16 |
| 6,063,245 A | 5/2000 | Frach et al. ........... 204/192.15 |
| 6,150,015 A | 11/2000 | Bertero et al. .............. 428/332 |
| 6,156,154 A | 12/2000 | McLeod et al. ....... 156/345.42 |
| 6,156,171 A | 12/2000 | Hollars et al. ......... 204/298.25 |
| 6,231,732 B1 | 5/2001 | Hollars et al. ......... 204/298.26 |
| 6,290,821 B1 | 9/2001 | McLeod ................ 204/192.12 |
| 6,328,856 B1 | 12/2001 | Brucker ................ 204/192.12 |
| 6,338,777 B1 | 1/2002 | Longstreth White ... 204/192.15 |

*Primary Examiner*—Steven Versteeg (57) ABSTRACT

A system and method for sputtering using a plurality of different bias voltages, a plurality of target-cathodes that can be powered at different voltages disposed along said path of travel, and a controller configured to selectively vary the target-cathode voltage and the pallet bias voltage while the pallet moves along the path of travel. The target-cathodes are spaced apart along the path of travel by a distance less than a length of the pallet and on both sides of the path of travel. The controller can include a timing circuit for synchronizing changes in the target-cathode voltages with changes in the pallet bias voltage.

17 Claims, 9 Drawing Sheets

TIMING APPARATUS AND METHOD TO SELECTIVELY BIAS DURING SPUTTERING

CROSS REFERENCE TO RELATED APPLICATIONS

This application claims the benefit of U.S. Provisional Application No. 60/400,797, filed Aug. 2, 2002.

BACKGROUND OF THE INVENTION

1. Field of the Invention

The present invention relates generally to manufacturing processes involving the coating of substrates. More particularly, the present invention relates to apparatuses and methods used for sputtering thin films.

2. Description of the Related Art

Various manufacturing processes involve the deposition or coating of multiple layers of materials on a substrate by sputtering. A basic sputtering operation includes bombarding a target material with ions to release atoms from the surface of the target. The released atoms are directed towards the substrate so that they become deposited on the surface of the substrate. To build up the desired multiple layers of different materials, the sputtering operation is repeated with a previously coated substrate, using targets of different materials in each sputtering operation.

To increase production yield, pallets are used to support and transport the substrates through the various sputtering operations, with each pallet being designed to carry a plurality of substrates arranged in an array. To obtain desirable films characteristics as well as improve yields, a bias voltage is often applied to the substrates during the sputtering process. While using a pallet may be more efficient than processing the substrates individually, it also means that all the substrates on the same pallet are set to the same bias voltage. Since the deposition of different materials are optimized at different bias voltages, the targets for depositing one material have to be separated from the targets for depositing another material by at least the length of the pallet used. It follows that the manufacturing cost for depositing several layers of different materials increases significantly with the number of layers deposited.

The making of magnetic media used in conventional disc drives is one example. Conventional disc drives are used to magnetically record, store and retrieve digital data. Data is recorded to and retrieved from one or more discs that are rotated at more than one thousand revolutions per minute (rpm) by a motor. The data is recorded and retrieved from the discs by an array of vertically aligned read/write head assemblies, which are controllably moved from data track to data track by an actuator assembly.

The three major components making up a conventional hard disc drive are magnetic media, read/write head assemblies and motors. Magnetic media, which is used as a medium to magnetically store digital data, typically includes a layered structure, of which at least one of the layers is made of a magnetic material, such as CoCrPtB, having high coercivity and high remnant moment. The read/write head assemblies typically include a read sensor and a writing coil carried on an air bearing slider attached to an actuator. This slider acts in a cooperative hydrodynamic relationship with a thin layer of air dragged along by the spinning discs to fly the head assembly in a closely spaced relationship to the disc surface. The actuator is used to move the heads from track to track and is of the type usually referred to as a rotary voice coil actuator. A typical rotary voice coil actuator consists of a pivot shaft fixedly attached to the disc drive housing closely adjacent to the outer diameter of the discs. Motors, which are used to spin the magnetic media at rates of higher than 10,000 revolutions per minute (rpm), typically include brushless direct current (DC) motors. The structure of disc drives is well known.

Figure 1A:
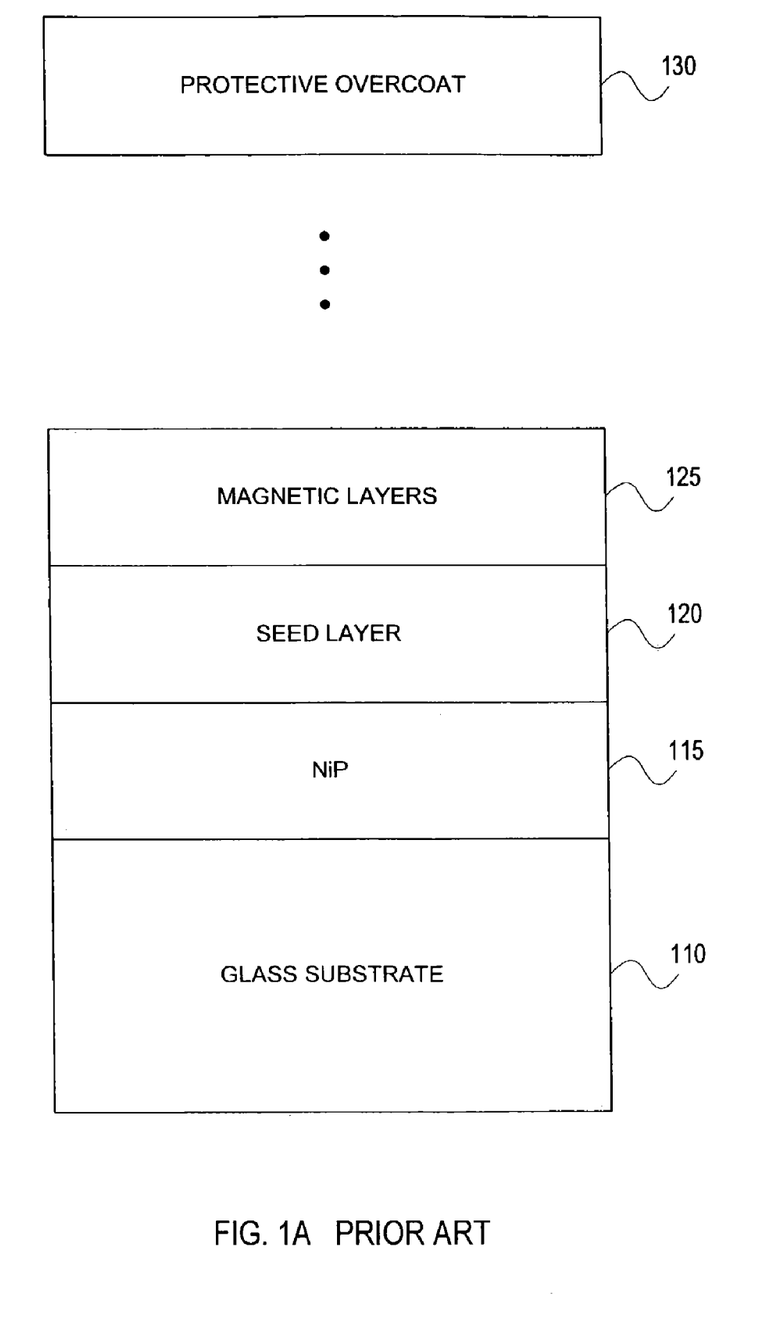
FIG. 1A is a block diagram showing a prior art conventional magnetic media structure.

FIG. 1A illustrates a conventional magnetic media structure comprising a substrate 110, a nickel-phosphorous (NiP) layer 115, a seed layer 120, a magnetic layer 125 and a protective layer 130. The substrate 110 is typically made of aluminum or high quality glass having few defects. The nickel-phosphorous (NiP) layer 115 is an amorphous layer that is usually electrolessly plated or sputtered onto the substrate 110. The NiP layer is used to enhance both the mechanical performance and magnetic properties of the disk. The NiP layer enhances the mechanical properties of the disk by providing a hard surface on which to texture. The magnetic properties are enhanced by providing a textured surface that improves the magnetic properties including the orientation ratio (OR).

Seed layer 120 is typically a thin film made of chromium that is deposited onto the NiP layer 115 and forms the foundation for structures that are deposited on top of it. Magnetic layer 125, which is deposited on top of seed layer 120, typically includes a stack of several magnetic and non-magnetic layers. The magnetic layers are typically made out of magnetic alloys containing cobalt (Co), platinum (Pt) and chromium (Cr), whereas the non-magnetic layers are typically made out of metallic non-magnetic materials. Finally, protective overcoat 130 is a thin film typically made of carbon and hydrogen, which is deposited on top of the magnetic layers 125 using conventional thin film deposition techniques.

Figure 1B:
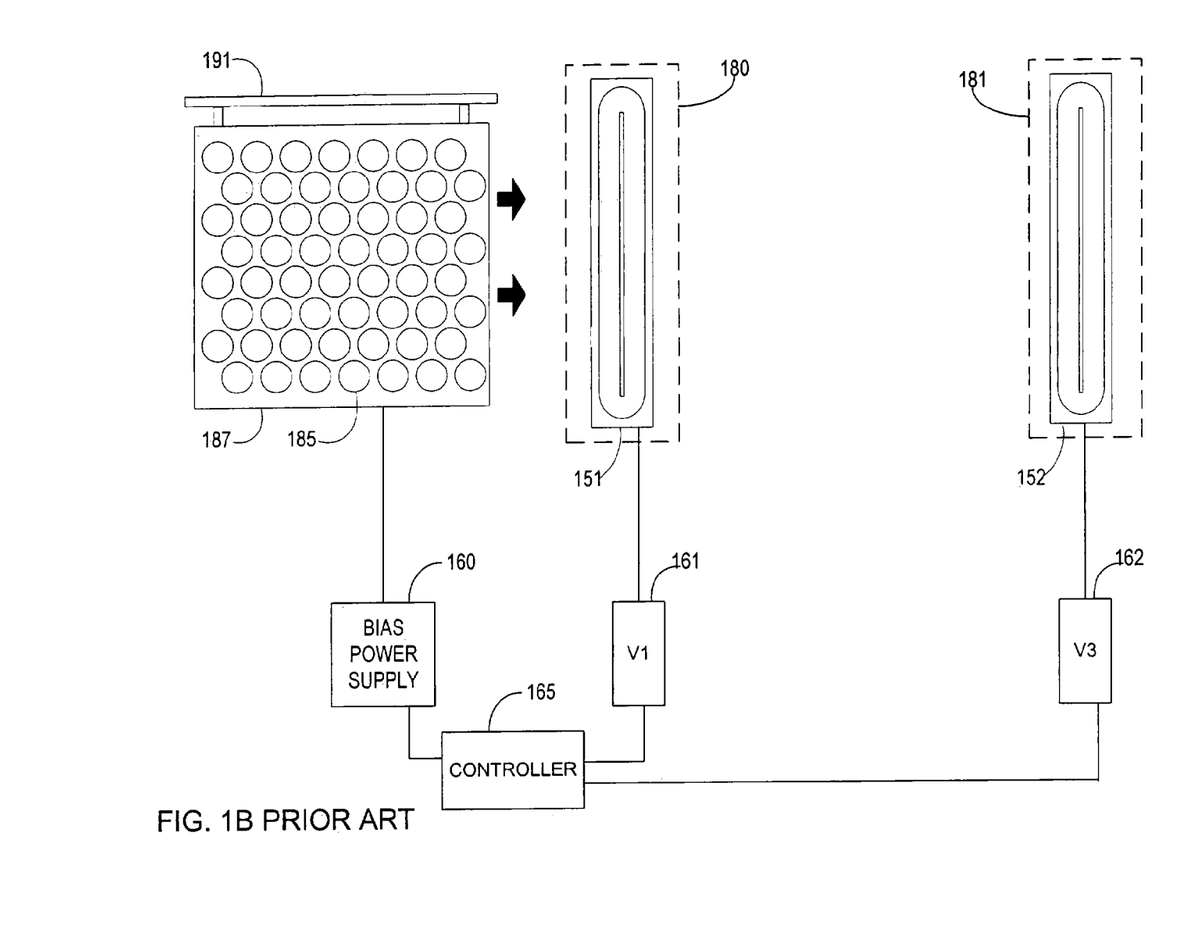
FIG. 1B is a block diagram showing the prior art method of making magnetic media.

FIG. 1B is an illustration showing a front view of one side of a conventional magnetron sputtering system used to sputter deposit layers of the magnetic media. FIG. 1B shows a first target-cathodes 151, and a second target-cathode 152, both with erosion zones and redeposition areas, each located within a vacuum chamber 180 and 181 respectively. FIG. 1B also shows substrates 185, a pallet 187 a beam 191, a voltage bias power supply 160, a first power supplies 161, a second power supply 162, and a controller 165. Vacuum chamber 180 and 181 are conventional chambers, typically made of stainless steel that house target-cathodes 151 and 152 respectively, as well as a transport (not shown). Pallet 187 is typically made of aluminum and is machined to hold substrates 185 in an upward position and in an array. Beam 191 is typically a stainless steel beam from which pallet 187 hangs and is transported in vacuum chamber 180. The target-cathodes include both the target material to be sputtered, the cathode for applying a voltage to the target material, appropriate electrical connections, and cooling mechanism if needed along.

In FIG. 1B the target-cathodes are spaced apart so that first target-cathode 151 can be set at first voltage, second target-cathode 152 can be set at a second voltage, and pallet 187 can have a bias voltage set at different bias voltages for each of the target-cathodes. Pallet 187 is biased at a first bias voltage using the voltage bias power supply 160 and then transported in front of first target-cathode 151, which is set to voltage V1. Before the bias voltage can be set to a different level, pallet 187 must be transported completely passed first target-cathodes 151. Once the pallet 187 is moved passed first target-cathodes 151, the new and different bias voltage is set and the pallet is moved passed the second target-cathode 152, which is set to voltage V2. The pallet 187 must be moved completely passed first target-cathode 151 before the bias voltage can be changed because all of the substrates on the pallet are at the same bias voltage. Although using pallets to process multiple substrates is very efficient, there are disadvantages such as maintaining all substrates at the same process condition. For example, all the discs on the same pallet are set to the same bias voltage, although it may be advantage to have different parts of a pallet set at different bias voltages. This conventional means of applying different voltages is disadvantages because the pallet must be moved completely out passed the first two sets of target-cathodes before the bias voltage on the pallet can be changed. This translates to bigger sputtering systems that are more expensive to build and maintain.

In many applications it is advantageous to deposit different materials onto substrates that are biased at different voltages. Adjusting the substrate bias voltage according to the material being deposited optimizes thin film deposition processes. Since deposition processes are often optimized by adjusting the substrate bias voltage depending on the material to be deposited and all of the substrates on a pallet must be biased to the same voltage level, the target-cathodes for depositing one material have to be separated from the target-cathodes for depositing another material by at least the length of the pallet used.

These disadvantages become significant problems when depositing films in a manufacturing environment where throughput, costs, and floor space are major considerations. These problems are particularly important in the manufacture of disc drives because of the complexity of the magnetic media and the requirement that it be made inexpensively. The restriction of having to place target-cathodes far apart when using pass-by sputter tools significantly impacts the practicality of making magnetic media with pass-by sputter tools because complex magnetic media structures, as described with reference to FIG. 1, contain multiple layers that are often processed with different substrate bias voltages. Similar limitations exist on the use of pass-by sputter tools, as well as similar tools, in all industries that require depositing multiple layers on many substrates.

Therefore what is needed is a system and method that allows for variable biasing of a pallet loaded with discs, so that sputtering cathodes requiring different pallet biasing, do not have to be separated by at least the length of the pallet.

SUMMARY OF THE INVENTION

The invention provides a system and method for variable voltage biasing of a pallet loaded with discs, so that sputtering target-cathodes requiring different pallet voltage biasing, do not have to be separated by at least the length of a pallet.

One embodiment of the invention includes a sputter system having a pallet moveable along a path of travel and capable of being biased at a plurality of different bias voltages, a plurality of target-cathodes that can be powered at different voltages disposed along the path of travel, and a controller configured to selectively vary both target-cathode voltage and the pallet bias voltage, while the pallet moves along the path of travel. The target-cathodes, which can be located along the path of travel and can be on both sides of the path of travel, are spaced apart by a distance less than the length of the pallet. The controller can include a timing circuit for synchronizing changes in the target-cathode voltages with changes in the pallet bias voltage.

The invention also includes a method of sputtering layers of materials onto substrates carried by a pallet that includes moving the pallet along a path of travel, applying a variable bias voltage to the pallet, applying a different voltages to different target-cathodes for sputtering different materials, and selectively varying the target-cathodes voltages and the pallet bias voltage while the pallet is moving and in front of the target-cathodes. This method also includes selectively varying each of the target-cathodes voltages and pallet bias voltages according to a predetermined sequence saved in a schedule.

A magnetic recording medium made by this sputter system and method is also disclosed. The magnetic recording medium made in accordance with the system and method disclosed includes a substrate for depositing layers thereon, a seed layer sputter deposited onto the substrate for defining the growth of subsequent layers, a magnetic layer sputter deposited onto the seed layer, and a protective overcoat sputter deposited onto the magnetic layer for protecting the magnetic layer. At least one of the sputter deposition processes used to make the magnetic recording medium is done by applying a variable bias voltage to the pallet, applying different voltages to the different target-cathodes for sputtering different materials, and selectively varying the target-cathodes voltages and the substrate bias voltage while the substrate is moving and in front of the different target-cathodes.

A disc drive for recording and retrieving data using the magnetic recording medium made in accordance with this invention is also disclosed in this invention.

BRIEF DESCRIPTION OF THE INVENTION

DETAILED DESCRIPTION OF THE PREFERRED EMBODIMENTS

The invention provides a system and method for variable voltage biasing of a pallet loaded with discs, so that sputtering target-cathodes requiring different pallet voltage biasing, do not have to be separated by at least the length of the pallet.

Figure 2:
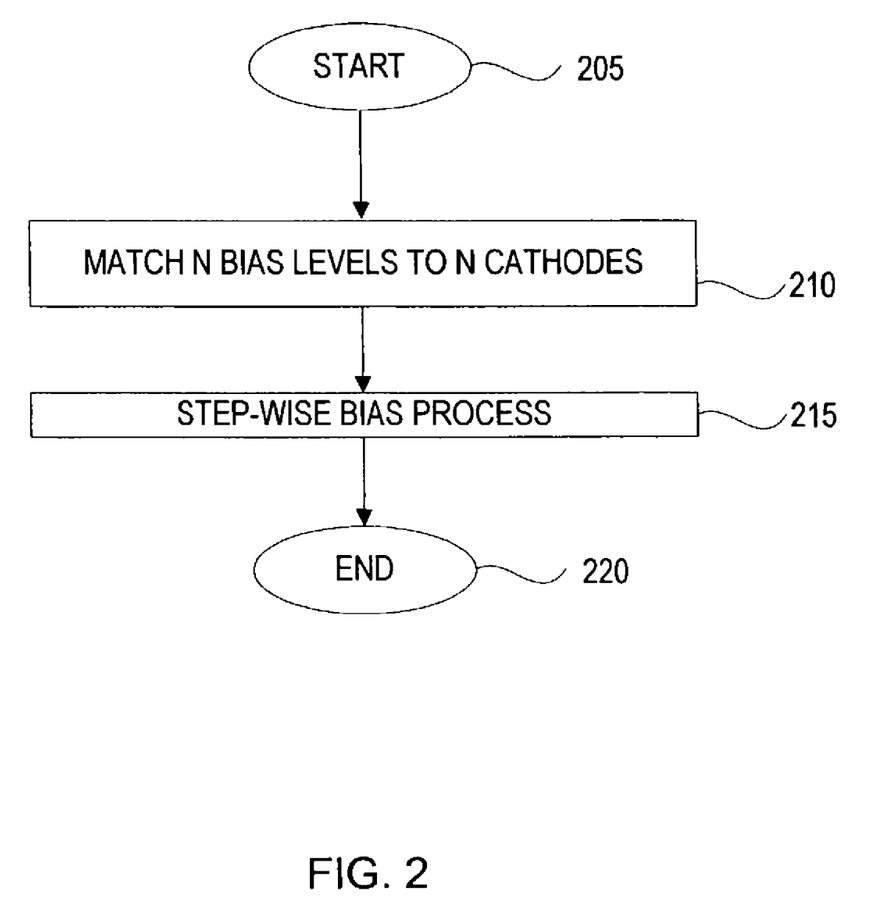
FIG. 2 is a flowchart illustrating a method of making magnetic media in accordance with one embodiment of the invention.

FIG. 2 is a flowchart illustrating a method of making magnetic media using a pallet for transporting multiple substrates that can be biased to different voltage levels in accordance with one embodiment of the invention. In step 205 the pallet containing substrates is started in motion in the pass-by sputter system toward the target-cathodes preparing it for sputter depositing films in the sputtering chamber having multiple bias voltage levels by moving it into position. Next in step 210 the desired bias levels are matched to each target-cathode generating a schedule that matches pallet voltage bias level, target-cathode number, target-cathode voltage, time each one should be turned on and off. The schedule can be a table listing when all of these components are turned on and off and to which levels they are set. If the sputtering process uses N number of target-cathodes each having a different bias then the bias level is matched to each target-cathode so that when the a specific target-cathode is activated the corresponding correct bias level is also activated. Next in step 215 the step-wise bias process is performed allowing for variable biasing of the pallet loaded with substrates as is further discussed with reference to FIG. 3 below. This step allows each layer deposited on the substrate to be biased at a potential level that optimizes microstructure for the material. Finally in step 220 the process ends when the substrates are completely coated and the target-cathodes are turned off. In a typical pass-by sputter system the pallet is usually moved out of the sputtering chamber at step 220.

Figure 3:
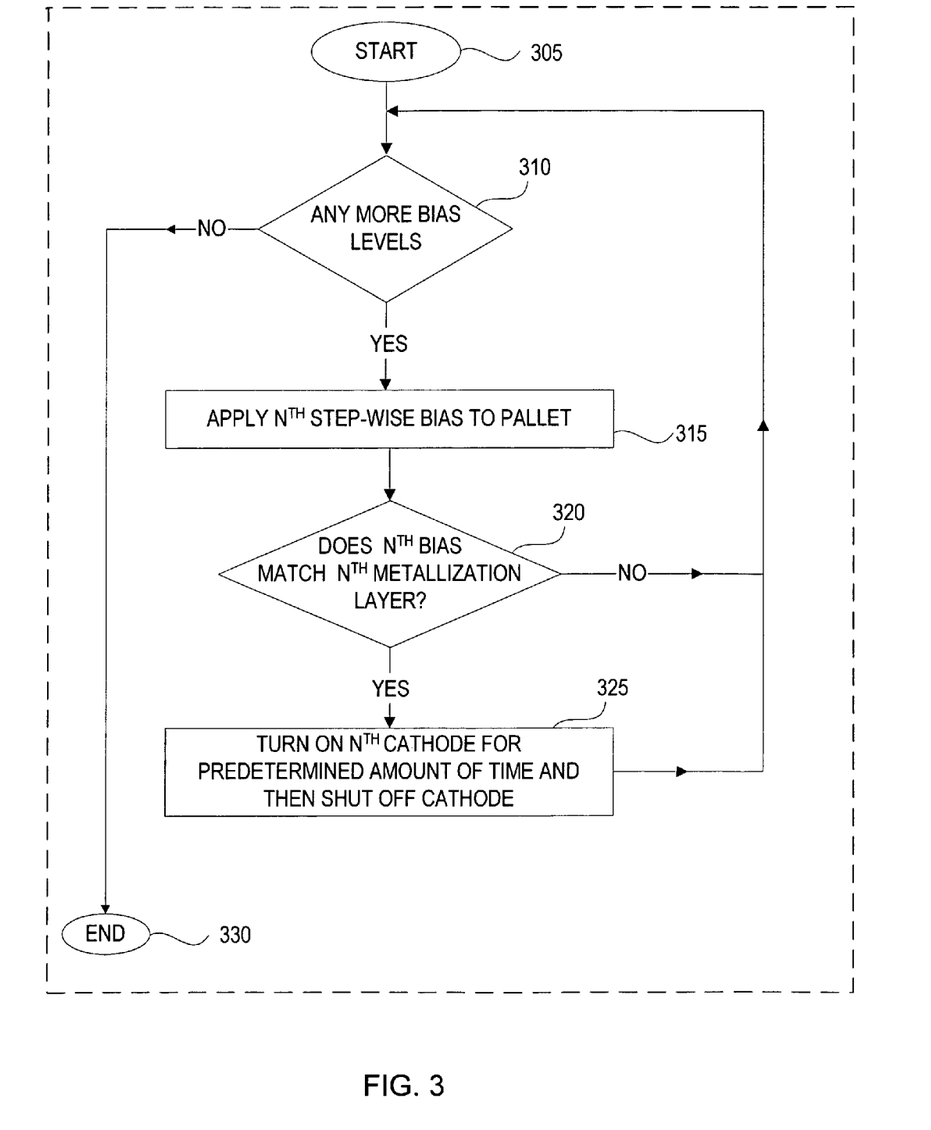
FIG. 3 is a flowchart showing details of step 215 in the flowchart of FIG. 2.

FIG. 3 is a flowchart showing details of step 215 in the flowchart of FIG. 2. First in step 305, the pallet and loaded substrates move toward the deposition chamber. Next in step 310 a decision is made as to whether any more pallet bias voltages are needed. If the decision is YES then the correct bias voltage is set in step 315 and if the decision is NO then the process moves to step 330 where it ends. Next in step 315 the desired bias level is applied to the pallet. The bias voltage applied to the pallet is determined in accordance to the schedule generated in step 210. Next in step 320 a check is done to confirm that the bias level being applied matches the desired bias level for the giving layer to be deposited according to the schedule generated in step 210. Step 320 is optional and is done only as a precaution. The process can progress to the next step 325 without completing step 320 because the time required to perform step 320 may affect throughput. In such a situation an error can be recorded if the correct voltage values are not reached. Next in step 325 the first target-cathode is turned on, set to the desired voltage according to the schedule generated in step 210, and left on at that voltage for a predetermined amount of time. All of this is done while the pallet is moving with a bias voltage on it. After the predetermined time lapses, the target-cathode is shut off and the process goes back to step 310 where another decision is made as to whether any more bias levels are needed. In order for step 215 to work properly the bias voltages need to be switched quickly. This is accomplish by using a bias power supply having a repetition rate high enough that the pallet does not move a significant amount during the target-cathode off-time as is further discussed with reference to FIG. 4 below.

Figure 4:
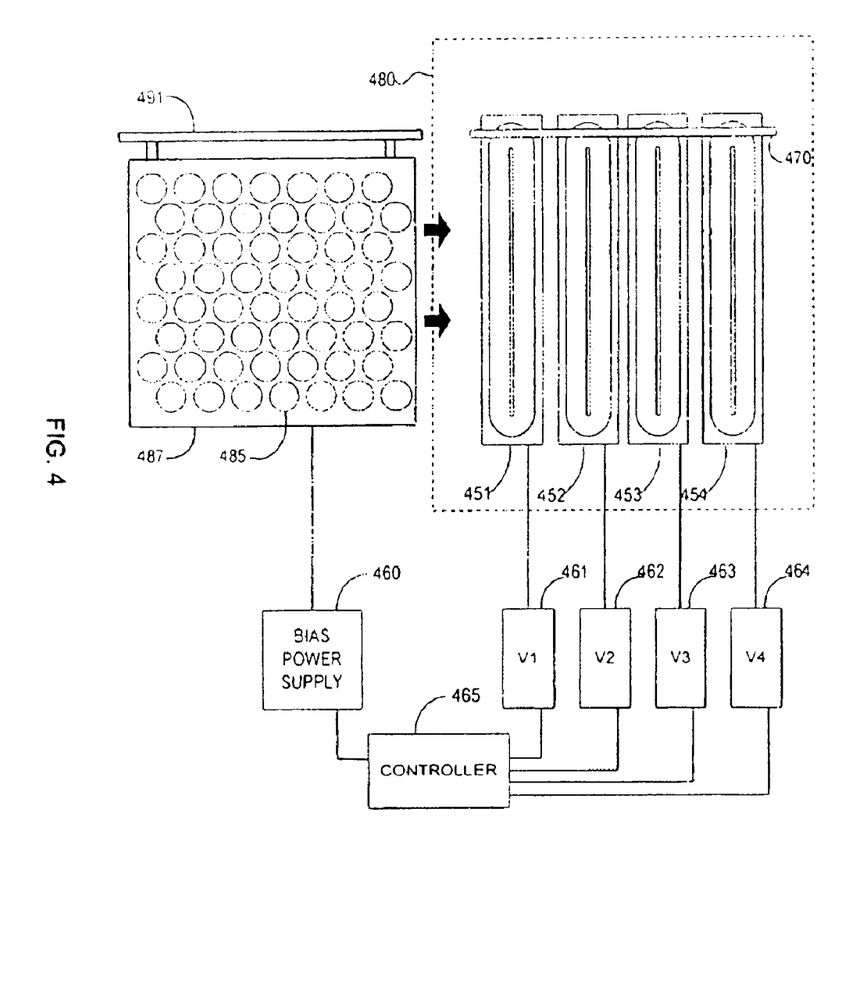
FIG. 4 is a block diagram illustrating an apparatus for carrying out the steps described with reference to FIGS. 2 and 3 in accordance with one embodiment of the invention.

FIG. 4 is a block diagram illustrating an apparatus for carrying out the steps described with reference to FIGS. 2 and 3 in accordance with one embodiment of the invention. FIG. 4 includes a first target-cathode 451, a second target-cathode 452, a third target-cathode 453, a fourth target-cathode 454, a transport 470 located within a vacuum chamber 480, a plurality of substrates 485, a pallet 487, a beam 491 a bias power supply 460, a first target-cathode power supply (V1) 461, a second target-cathode power supply (V2) 462, a third target-cathode power supply (V3) 463, a fourth target-cathode power supply (V4) 464, and a controller 465. The target-cathodes 451–454 are all shown with erosion zones and redeposition areas Vacuum chamber 480 is a conventional chamber, typically made of stainless steel which houses the first target-cathode 451, second target-cathode 452, third target-cathode 453, fourth target-cathode 454, and transport 470. Unlike the prior art described with reference to FIG. 1B, the target-cathodes do not have to be spaced one pallet length apart. The invention permits the same process to be run on these closely spaced target-cathodes as was run on the system with separated target-cathodes shown in FIG. 1B. Pallet 487 is typically made of aluminum and is machined to hold substrates 485 in an array and in an upward position. The pallet 487 is designed to support the substrates by their edges so that both major surfaces of each substrate are exposed during sputtering. Beam 491 is typically a stainless steel beam used to transport pallet 487 in and through vacuum chamber 480. Pallet 487 hangs from beam 491.

The bias power supply 460 is coupled to the pallet 487 and should have a repetition rate that is high enough so that the pallet 487 does not move a significant amount during the target-cathode off-time. The high bias power supply repetition rate helps with film thickness uniformity across the substrates in the direction of travel. The first target-cathode power supply (V1) 461 is used to provide power to the first target-cathode 451 and can be an RF power supply, a DC power supply, or an AC power supply. Other types of power supplies having appropriate repetition rates can be used for this application as well. Similarly, the second target-cathode power supply (V2) 462, third target-cathode power supply (V3) 463, and fourth target-cathode power supply (V4) 464 are used to supply power to target-cathodes 452, 453, and 454 respectively. Controller 465 can be a programmable logic controller (PLC) containing a timing circuit. The PLC is used to generate a schedule for synchronizing the bias voltages and target-cathode power. Controller 465 is also used to set bias voltages, turn target-cathodes on and off, select target-cathode powers and keep track of time.

According to one embodiment of the present invention, there are multiple pairs of target-cathodes, each pair being characterized by an optimal voltage $V_1, V_2, \ldots, V_n$ respectively that is recorded in a schedule. A circuit found in controller 465 is provided to synchronize voltage levels of the target-cathodes and bias voltages. Preferably, the changes in the target-cathode voltage and the pallet bias voltage are initiated or controlled by a timing circuit.

The rate of travel of the pallet is generally dependent on the equipment used and the nature of the manufacturing process. While the rate of travel may be set as fast as is desirable within equipment confines, it should preferably be slow enough with respect to the switching time of the power supplies. The slower rate of travel helps achieve better thickness uniformity of deposited films across the substrates in the direction of travel of the pallet and is therefore preferable.

Comparing FIG. 4 with the prior art FIG. 1B, the advantages placement of target-cathodes closer to each other, in accordance with one embodiment of the invention, is illustrated. In this embodiment of the invention, there is no need to space the target-cathodes apart from each other by at least the length of the pallet. Doing away with this minimum spacing requirement significantly reduces the required size required of the processing tool for the same number of target-cathodes used, and also facilitates the manufacture of multi-layer structures.

Figure 5A:
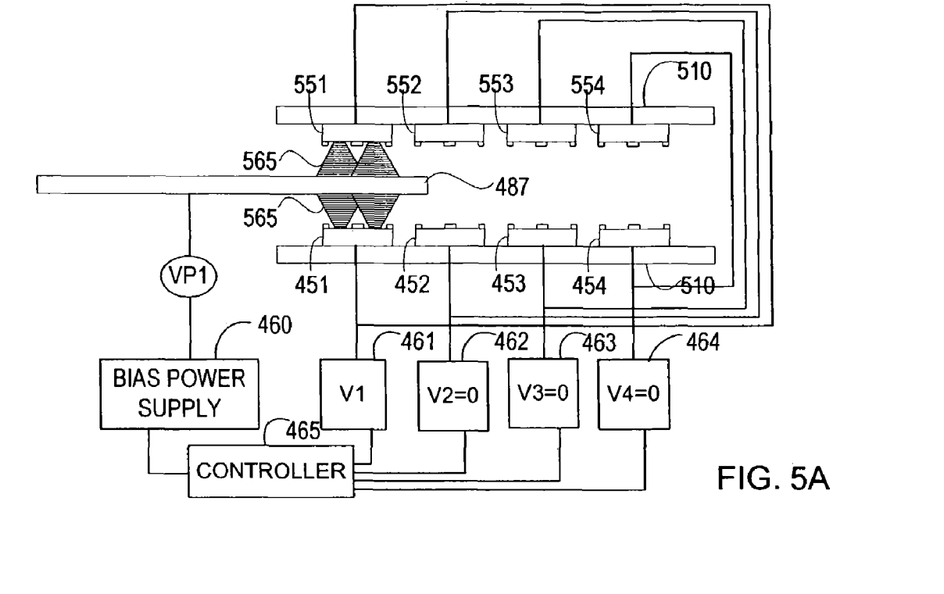
FIG. 5A is a block diagram showing a top view of the FIG. 4 apparatus in the first step of a four-step process applying a first bias voltage to a pallet.
Figure 5B:
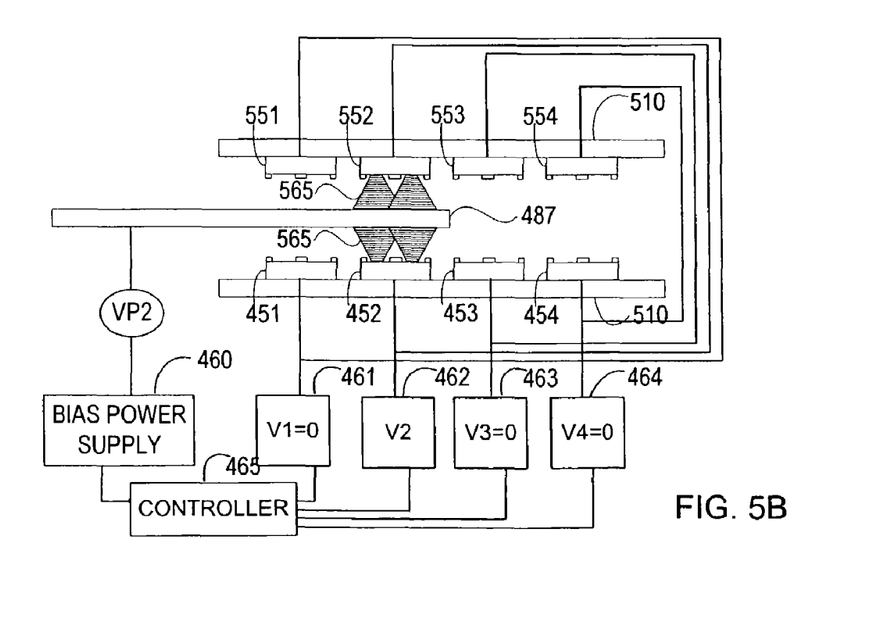
FIG. 5B is a block diagram showing a top view of the FIG. 4 apparatus in the second step of a four-step process applying a second bias voltage to a pallet.
Figure 5C:
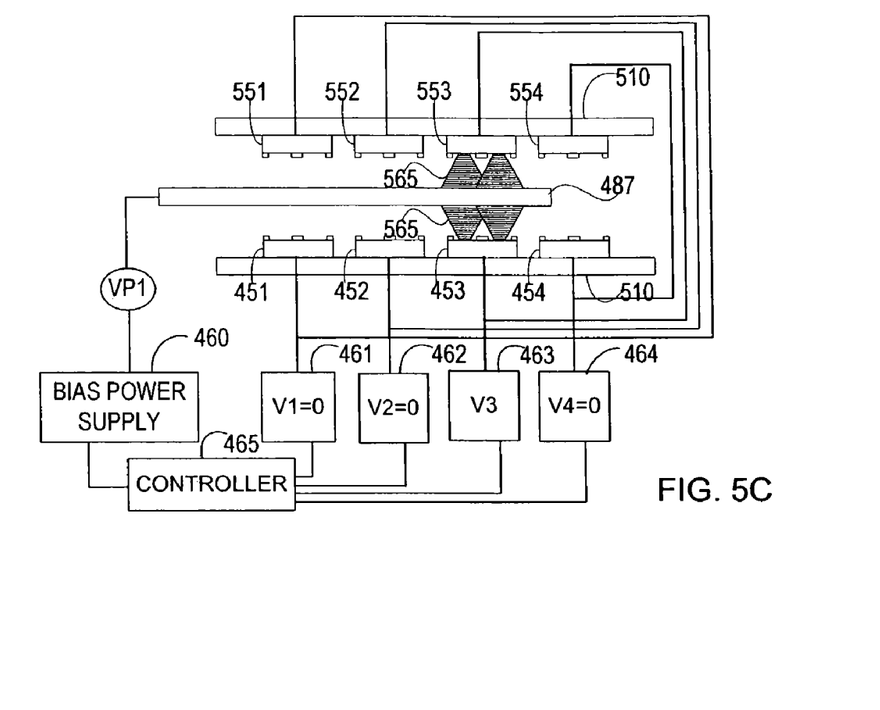
FIG. 5C is a block diagram showing a top view of the FIG. 4 apparatus in the third step of a four-step process applying a third bias voltage to a pallet.
Figure 5D:
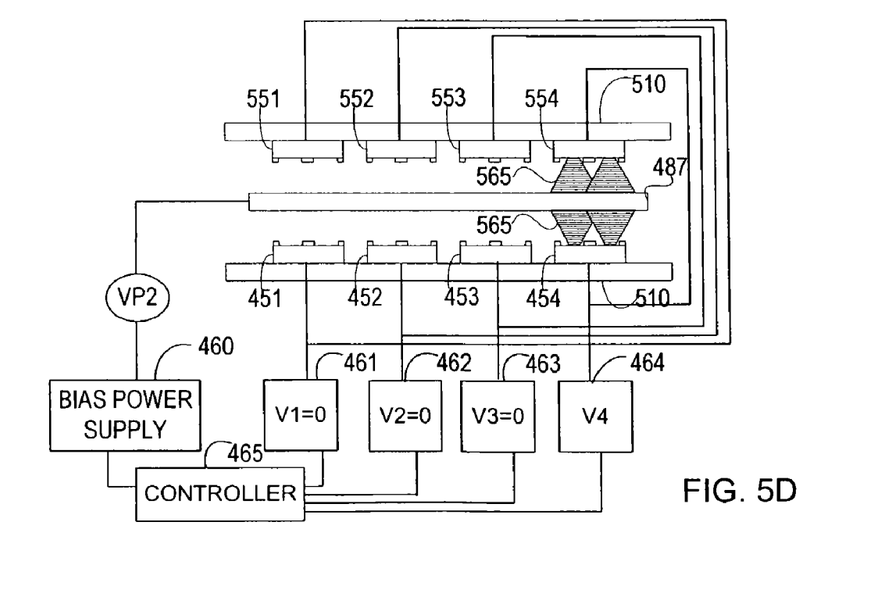
FIG. 5D is a block diagram showing a top view of the FIG. 4 apparatus in the fourth step of a four-step process applying a fourth bias voltage to a pallet.

FIG. 5A–5D are block diagrams showing detailed top views of the apparatus in FIG. 4 at different stages of a four-step bias voltage process. FIG. 5A–5D show chamber walls 510 and an additional four target-cathodes positioned on the opposite side of the direction of travel of the pallet. Fifth target-cathode 551 is positioned opposite first target cathode 451, sixth target-cathode 552 is positioned opposite second target cathode 452, seventh target-cathode 553 is positioned opposite third target cathode 453, and eighth target-cathode 554 is positioned opposite fourth target cathode 454. FIG. 5A shows the process in the first step of the four-step voltage bias process. FIG. 5B shows the process in the second step of the four-step voltage bias process. FIG. 5C shows the process in the third step of the four-step voltage bias process. FIG. 5D shows the process in the fourth step of the four-step voltage bias process.

In FIG. 5A, the bias voltage is set at VP1, the first target-cathodes 451 and fifth target-cathode 551 are both set to a voltage, of V1 causing plasma 565 to ignite while the remaining target-cathodes are off. Pallet 487 is subjected to the bias voltage VP1 and moves from left to right passing in front of the plasma 565 getting a film deposited on it. The bias voltage can be applied on pallet 487 through a bias rail or other means as is well known in the art. The pallet moves in the direction of the arrow shown in FIG. 4 or from left to right by being driven with a conveyer system. Both first target-cathodes 451 and fifth target-cathode 551 are maintained at voltage V1 for a predetermined fixed amount of time in accordance with the schedule discussed with reference to FIG. 2 above. In an alternative embodiment a sensor can be used to locate the position of the pallet and set all the voltages according to where the pallet is located. In this alternative embodiment the schedule would have pallet position as one of its entries.

FIG. 5B is a block diagram showing a top view of the FIG. 4 apparatus in the second step of a four-step voltage bias process. In this step the second target-cathode 452 and fifth target-cathode 552 are both set to a voltage of V2 causing plasma 565 to ignite again while the remaining target-cathodes are off according to the schedule defined with reference to FIG. 2 above. After a timer indicates that a predetermined amount of time has elapsed, this step begins by shutting off the first target-cathode power supply 461, changing the pallet bias voltage to VP2, and turning on and setting the second target-cathode power supply 462 to voltage V2. This switching process is done quickly so that the amount of distance the pallet 487 travels during the switching process is small. Usually, the switching time takes between 10 milliseconds and 20 milliseconds and since the pallet travels about 20 feet per second, the distance the pallet has moved during the transition is very small.

FIG. 5C is a block diagram showing a top view of the FIG. 4 apparatus in the third step of a four-step voltage bias process. In this step the third target-cathode power supply 463 is set to voltage V3, bias voltage is set to VP3 and the remainder of the target-cathode voltages are set to zero according to the schedule defined with reference to FIG. 2 above. The switch to this configuration from the configuration described with reference to FIG. 5B occurs as described above.

FIG. 5D is a block diagram showing a top view of the FIG. 4 apparatus in the fourth step of a four-step voltage bias process. In this step the fourth target-cathode power supply 464 is set to voltage V4, bias voltage is set to VP4 and the remainder of the target-cathode voltages are set to zero according to the schedule defined with reference to FIG. 2 above. The switch to this configuration from the configuration described with reference to FIG. 5C occurs as described above.

Figure 6:
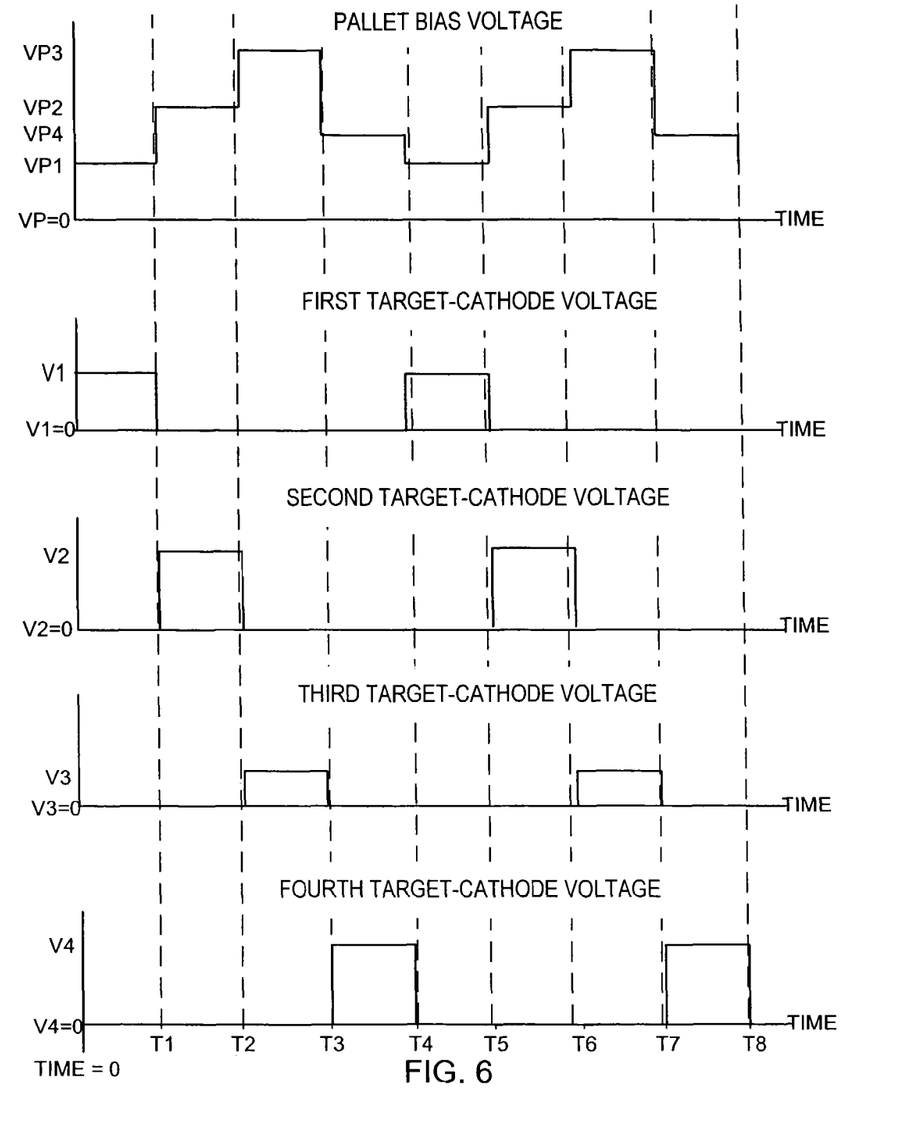
FIG. 6 is a chart showing the voltage profile occurring in the method of making magnetic media in a four-step voltage bias process.

FIG. 6 is a chart showing the voltage profile occurring in the method of making magnetic media in accordance with one embodiment of the invention. The voltage profile of FIG. 5A is represented by the time in the range from 0 to T1 when the pallet bias voltage is set at VP1, first target-cathode 451 voltage set at V1, second target-cathode 452 voltage set at zero, third target-cathode 453 voltage set at zero, and fourth target-cathode 454 voltage set at zero. The voltage profile of FIG. 5B is represented by the time in the range from T1 to T2 when the pallet bias voltage is set at VP2, first target-cathode 451 voltage set at zero, second target-cathode 452 voltage set at V2, third target-cathode 453 voltage set at zero, and fourth target-cathode 454 voltage set at zero. The voltage profile of FIG. 5C is represented by the time in the range from T2 to T3 when the pallet bias voltage is set at VP3, first target-cathode 451 voltage set at zero, second target-cathode 452 voltage set at zero, third target-cathode 453 voltage set at V3, and fourth target-cathode 454 voltage set at zero. The voltage profile of FIG. 5D is represented by the time in the range from T3 to T4 when the pallet bias voltage is set at VP4, first target-cathode 451 voltage set at zero, second target-cathode 452 voltage set at zero, third target-cathode 453 voltage set at zero, and fourth target-cathode 454 voltage set at V4. This same routine is repeated for the next four times T5, T6, T7, and T8. All voltage values are set in accordance with a recipe detailed on a schedule.

Figure 7:
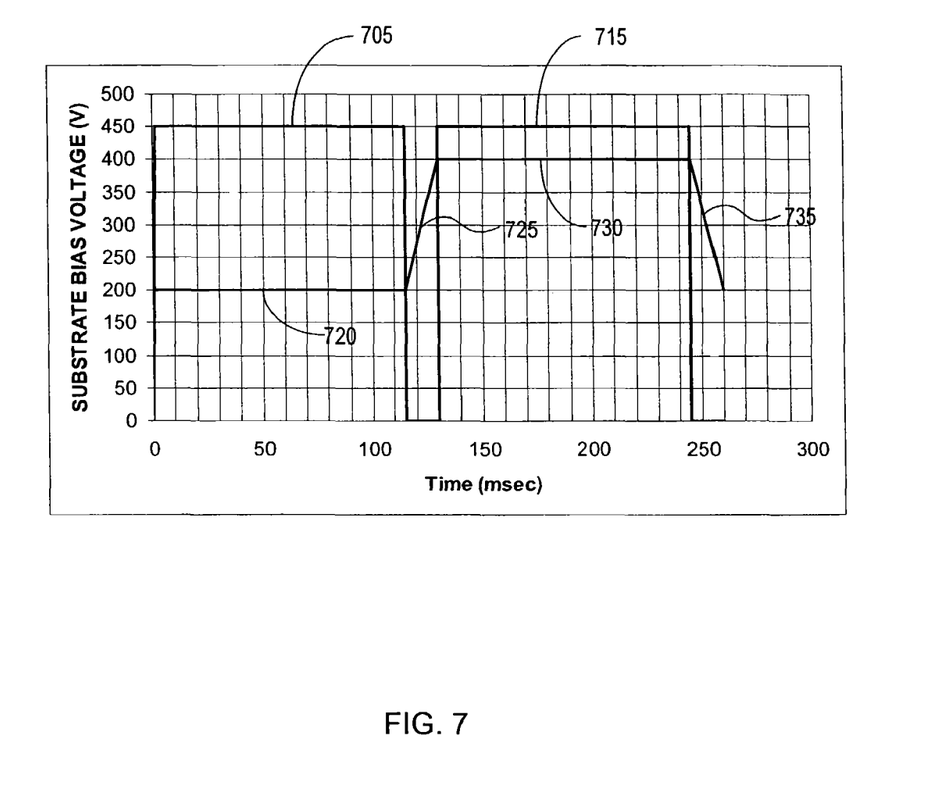
FIG. 7 is a detailed plot of bias voltage vs. time showing details of the transition between different bias voltages for a system having a single bias voltage step.

FIG. 7 is a plot of bias voltage vs. time showing details of the transition between different bias voltages for a system having a single bias voltage step. Curve 705 represents a voltage on the first target-cathode voltage, curve 715 represents a voltage on the second target-cathode, curve 720 represents a first bias voltage on the pallet, curve 725 represents a first transition bias voltage on the pallet, curve 730 represents a second bias voltage on the pallet, and curve 735 represents a second transition bias voltage on the pallet. FIG. 7 shows the first target-cathode is on and powered to 450 volts for 115 milli-seconds, and then shut off for 15 milli-seconds and the second target-cathode turned on and powered to 450 volts for another 115 milli-seconds. FIG. 7 also shows the bias voltage set at 200 volts for the first 115 milli-seconds while the first target-cathode is on, the bias voltage transition from 200 volts to 400 volts in 15 milli-seconds, the bias voltage remaining at 400 volts for the first 115 milli-seconds while the second target-cathode is on, and finally the bias voltage transition back to 200 volts in 15 milli-seconds. Additionally, FIG. 7 shows both target-cathodes operating at 46% duty cycle with each target-cathode firing at 2.2 times normal power for 115 milli-seconds.

It will also be recognized by those skilled in the art that, while the invention has been described above in terms of preferred embodiments it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

What is claimed is:

1. A sputter system comprising:
   a pallet capable of being biased at a plurality of different bias voltages, the pallet being movable along a path of travel;
   a plurality of target-cathodes disposed along said path of travel, wherein each said target-cathode can be powered at different voltages; and
   a controller configured to selectively vary the target-cathode voltage and the pallet bias voltage while the pallet moves along the path of travel and the pallet is in front of more than one of said plurality of target-cathodes, wherein said controller includes a timing circuit for synchronizing changes in the target-cathode voltages with changes in the pallet bias voltage.

2. The sputter system of claim 1 in which said target-cathodes are spaced apart along the path of travel by a distance less than a length of the pallet.

3. The sputter system of claim 1 in which said target-cathodes are disposed on both sides of the path of travel.

4. The sputter system of claim 1 wherein said plurality of target-cathodes include targets made from different materials, wherein each said material is characterized by a preferred pallet bias voltage.

5. The sputter system of claim 4 wherein said plurality of target-cathodes are successively set to their respective preferred pallet bias voltages.

6. The sputter system of claim 1 in which the controller is configured to supply a voltage bias to pairs of the cathode targets in turn within a cycle time.

7. The sputter system of claim 6 wherein the pallet is configured to move a minimal distance along the path of travel within the cycle time.

8. The sputter system of claim 1 further including a schedule for selectively supplying voltages according to time.

9. The sputter system of claim 8 wherein said schedule further includes timing and sequencing of voltages information.

10. The sputter system of claim 1 further including a schedule for selectively supplying voltages according to position of said pallet.

11. A method of sputtering layers of materials onto substrates carried by a pallet, comprising the steps of:
    moving the pallet along a path of travel, the pallet being capable of having a bias voltage put on it;
    applying a bias voltage to said pallet, said pallet voltage being variable;
    applying a plurality of voltages to a plurality of target-cathodes for sputtering said materials from said plurality of target-cathodes; and
    selectively varying said plurality of target-cathodes voltages and said pallet bias voltage while said pallet is moving in front of said plurality of target-cathodes, wherein said step of selectively varying includes using a timing circuit to synchronize changes in the said target-cathode voltage with said pallet bias voltages.

12. The method of step 11 wherein selectively varying said plurality of target-cathodes voltages and said pallet bias voltage is done according to a predetermined sequence.

13. The method of claim 11 further comprising a step of providing adjacent sets of targets spaced apart along the path of travel by a distance less than a length of the pallet.

14. The method of claim 11 further comprising moving the pallet by a minimal distance along the path of travel within the cycle time.

15. The method of claim 11 further comprising the step of generating a schedule for selectively varying said plurality of target-cathodes voltages and said pallet bias voltage while said pallet is moving and in front of said plurality of target-cathodes.

16. The method of claim 15 wherein said selectively varying of said plurality of target-cathodes voltages and said pallet bias voltage is done as a function of time.

17. A sputter system comprising:
    means for supplying a different voltage to a plurality of target-cathodes;
    means for transporting a pallet containing a plurality of substrates in front of said plurality of target-cathodes while at least one of said plurality of target-cathodes is set to a target-cathode voltage;
    means for supplying a variable bias voltage to said pallet while said pallet is moving; and
    means for synchronizing the bias voltage on said pallet with the target-cathode voltage.

* * * * *